United States Patent
Okamoto et al.

(10) Patent No.: US 7,790,507 B2
(45) Date of Patent: Sep. 7, 2010

(54) SEMICONDUCTOR DIE COLLET AND METHOD

(75) Inventors: Dan Okamoto, Oita (JP); Seiichi Yamasaki, Oita (JP)

(73) Assignee: Texas Instruments Incorporated, Dallas, TX (US)

( * ) Notice: Subject to any disclaimer, the term of this patent is extended or adjusted under 35 U.S.C. 154(b) by 337 days.

(21) Appl. No.: 11/690,808

(22) Filed: Mar. 24, 2007

(65) Prior Publication Data

US 2008/0233680 A1 Sep. 25, 2008

(51) Int. Cl.
*H01L 21/00* (2006.01)
*H01L 21/58* (2006.01)
*H01L 21/677* (2006.01)

(52) U.S. Cl. ............ 438/118; 438/106; 257/E21.505

(58) Field of Classification Search ............ 257/676, 257/666, E21.505; 438/118, 106, 15, 127, 438/116; 414/217, 225.01; 156/285, 60, 156/287, 580

See application file for complete search history.

(56) References Cited

U.S. PATENT DOCUMENTS

| | | | | |
|---|---|---|---|---|
| 6,261,492 | B1 * | 7/2001 | Iovdalsky | 264/69 |
| 6,916,686 | B2 * | 7/2005 | Wada et al. | 438/118 |
| 2004/0089415 | A1 * | 5/2004 | Byun et al. | 156/285 |
| 2005/0221582 | A1 * | 10/2005 | Lee et al. | 438/455 |

FOREIGN PATENT DOCUMENTS

JP 2005-322815 * 11/2005

OTHER PUBLICATIONS

English language translation of JP2005-322815, downloaded Jul. 6, 2009.*

* cited by examiner

*Primary Examiner*—Thomas L Dickey
*Assistant Examiner*—Nikolay Yushin
(74) *Attorney, Agent, or Firm*—Yingsheng Tung; Wade J. Brady, III; Frederick J. Telecky, Jr.

(57) ABSTRACT

Semiconductor device assembly die attach apparatus and methods are disclosed for improvements in attaching a semiconductor die to a die pad. Preferred methods of the invention include steps for positioning a semiconductor die on a bearing surface of a collet and retaining the die on the bearing surface of the collet using a vacuum force. A pushing force is also exerted on the die adjacent to the applied vacuum force. The pushing force opposes flexion of the die in the direction of the vacuum force. In further steps, the die is placed on a die pad, and die attach adhesive is interposed between the die and the die pad. A preferred method includes applying a pushing force to bow the central region of the die toward the die pad. In a preferred apparatus of the invention, a collet has a body including a bearing surface for receiving a die and a vacuum for holding it. A chamber encompassed by the bearing surface is adapted for applying the force of expelled gas against a die borne on the bearing surface. The collet is configured for holding a die surface against the bearing surface and for simultaneously pushing outward on the center region of the die so held.

11 Claims, 4 Drawing Sheets

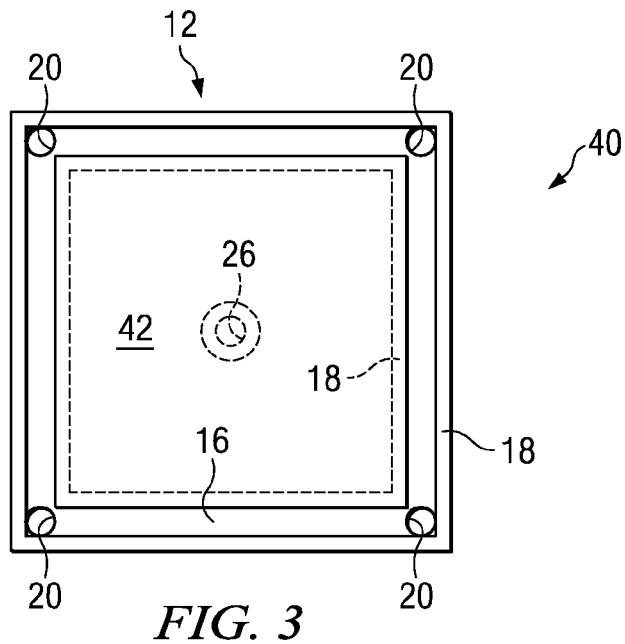
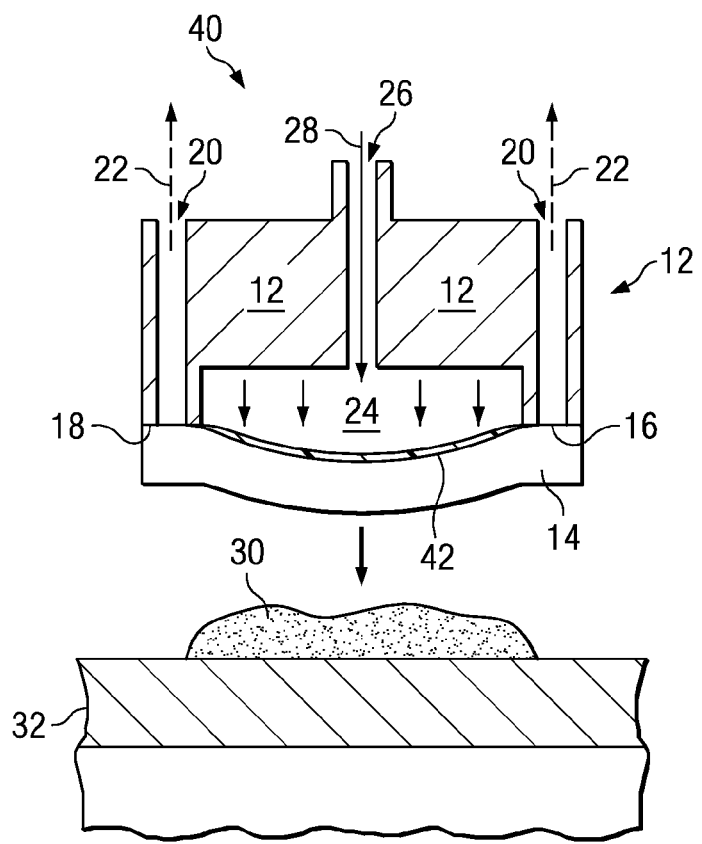
FIG. 3
FIG. 4A

SEMICONDUCTOR DIE COLLET AND METHOD

TECHNICAL FIELD

The invention relates to electronic semiconductor devices and manufacturing. More particularly, the invention relates to semiconductor device manufacturing and packaging and to die handling apparatus and related methods.

BACKGROUND OF THE INVENTION

In conventional semiconductor device assembly, it is known to use adhesive to permanently mount a semiconductor die to a mounting pad or substrate. Typical adhesive die attach processes use curable adhesive, such as epoxy or polyimide, as die attach material to affix the die to a die pad, leadframe, substrate, or socket, for convenience referred to herein generally as the die pad. It is common in the art to dispense die attach material in a controlled amount on a die pad. Die handling equipment used for die attach processes typically employs a pick-and-place tool to lift a die from a wafer tape or other holding mechanism and place it on a die pad. The portion of the die handling equipment that actually makes contact with the die is referred to as a collet. The die is placed on the collet, either by surface contact alone or with assistance from a mechanical ejector pin guiding the die onto the collet. A vacuum force exerted within the collet holds the die in the collet while the tool moves it into the appropriate position for placement on the pre-applied adhesive on the die pad.

Die handling presents technical challenges. Particularly for thin dice, which are becoming increasingly common in the arts, handling during die attach requires great care to avoid cracks or other damage. Some examples of die attach-related failure mechanisms known in the art include backside tool marks, scratches, or microcracks, which can eventually lead to die cracking. Thinner dice are in particular danger from microcracks, which can result from excessive flexing of the die during handling. The contact surfaces of die attach collets are sometimes made from relatively soft plastic or elastomeric materials instead of metal in an effort to avoid causing mechanical damage on the die surface. The practice of using a vacuum to hold the die in the collet is another example of efforts to avoid inflicting damage to fragile dice. The use of a prior art vacuum collet, however, tends to cause a thin die to flex forming a concavity during die placement, which can cause further problems. Damage to the surface of the die can also occur, particularly in the central region, due to contact with the collet.

The amount and distribution of die attach material between the die and the die pad can be crucial to the secure attachment of the die to the die pad and to the long term reliability of the completed assembly. Achieving the appropriate depth and uniform distribution of the die attach adhesive layer, also called the bond line, is a significant challenge. If the bond line is too thin, the bond may be insufficient to hold the die to the die pad. If the bond line is too thick, curing may be inhibited or prolonged, the bond may tend to weaken over time, thermal performance may suffer, or other problems may result. An uneven bond line resulting from non-uniform adhesive distribution can result in similar problems or in a combination of such problems. One of the most threatening problems a non-uniform distribution of adhesive can create is the formation of voids in the adhesive between the die and the die pad. Voids can lead to failures due to insufficient adhesive coverage or thermally induced stresses, for example. The formation of a concavity in the die surface, caused by the flexing of a thin die placed in a vacuum collet common in the arts, can induce these and other problems.

Generally, in addition to the formation of the bond line, a quantity of adhesive is pressed from between the die and the bond pad during die placement. The formation of adhesive that builds from the bond pad to the edges of the die is known as the die attach fillet. The formation of the fillet can be adversely affected by the excess, lack, or non-uniform distribution of adhesive in the formation of the bond line. Excessive die attach fillet may lead to die attach contamination of the die surface. Too little fillet may reduce the strength of the attachment and lead to eventual problems such as die lifting or die cracking. The formation of a proper fillet may be impeded by excessive, inconsistent, or unpredictable die flexion during placement of the die on the adhesive by a die handling collet.

Due to these and other problems, it would be useful and advantageous to provide semiconductor die handling apparatus and manufacturing methods with improved die handling capabilities, particularly for use with relatively thin and delicate dice.

SUMMARY OF THE INVENTION

In carrying out the principles of the present invention, using methods and equipment compatible with established manufacturing processes, improved semiconductor die handling collets contribute useful advantages to the art. The invention provides apparatus for the handling and placement of semiconductor dice and superior die attach techniques, resulting in improved semiconductor device assemblies.

According to one aspect of the invention, a method for attaching a semiconductor die to a die pad includes steps for positioning a die on a bearing surface of a collet and retaining the die on the bearing surface of the collet using a vacuum force. A pushing force is exerted on the die adjacent to the applied vacuum force. The pushing force is used to oppose flexion of the die in the direction of the vacuum force. In further steps, the die is placed on the die pad, with die attach adhesive interposed between the die and the die pad, the die is then released from the collet.

According to another aspect of the invention, in a method for attaching a semiconductor die to a die pad using a preferred embodiment of a collet, a pushing force is applied to the die in order to bow the central region of the die toward the die pad.

According to another aspect of the invention, a collet for handling a semiconductor die includes a body having a bearing surface for receiving the die. A chamber in the body has an open side bounded by the bearing surface, with a vacuum groove included in the bearing surface for holding a die against the bearing surface. A port is provided for transmitting an expelled gas to the chamber. The parts are arranged so that the vacuum force is adapted for holding the die surface against the bearing surface and the expelled gas is adapted for pushing the center of the die out from the interior of the chamber.

According to yet another aspect of the invention, in a preferred embodiment, a collet is provided wherein an expelled gas may be applied for pushing outward on the center of a die held therein such that the die extends outward beyond the plane of the bearing surface.

According to another aspect of the invention, a preferred embodiment of a collet includes a flexible skin attached to the body of the collet and situated for supporting a die held by the collet during handling.

According to still another aspect of the invention, a preferred embodiment of a semiconductor die attach system includes a collet having a die bearing surface. The collet is configured for retaining the die on the bearing surface using a vacuum force and also for applying a pushing force to an adjacent portion of the die in opposition to inward flexion of the die in the direction of the vacuum force. The system also includes a handling tool for moving the collet to a die pad, and placing the die on the die pad.

According to another aspect of the invention, a collet system features an arrangement whereby a pushing force may be applied to cause outward flexion of a die held by the collet such that a handling tool may bring the center region of the die into contact with a die pad in advance of the periphery.

According to another aspect of the invention, a collet system includes provisions for using pressurized gas for applying a pushing force to the center region of a die held to the collet by a vacuum force.

According to still another aspect of the invention, a semiconductor device assembly of the invention includes a flexed die with a cured bond line formed with the central region of the die thinner than the periphery.

The invention has advantages including but not limited to providing methods, apparatus, and systems offering improvements in die handling capabilities useful in the manufacture of semiconductor device packages. These and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which:

FIG. 3 is a bottom view of a die handling collet according to an example of an alternative preferred embodiment of the invention;

FIG. 4A is a cutaway side view of the die handling collet according to the example of a preferred embodiment of the invention of FIG. 3 shown in the context of a die attach system and method;

References in the detailed description correspond to like references in the various drawings unless otherwise noted. Descriptive and directional terms used in the written description such as first, second, top, bottom, upper, lower, side, and so forth, refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DETAILED DESCRIPTION OF PREFERRED EMBODIMENTS

Figure 1:
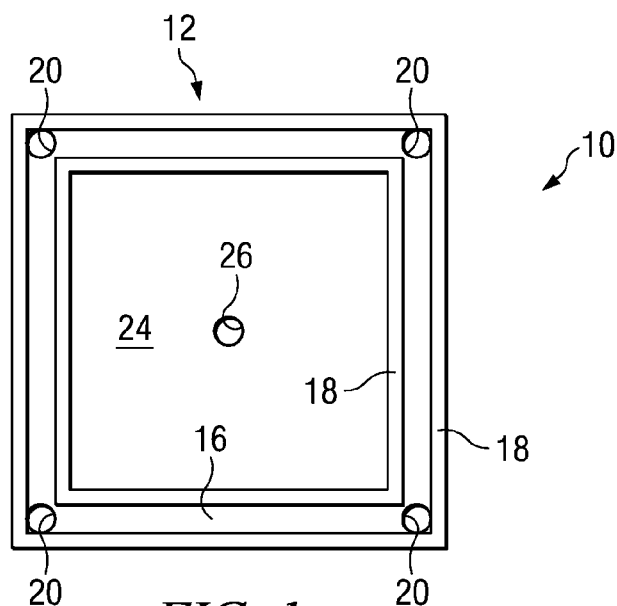
FIG. 1 is a bottom view of a die handling collet according to an example of a preferred embodiment of the invention.
Figure 2A:
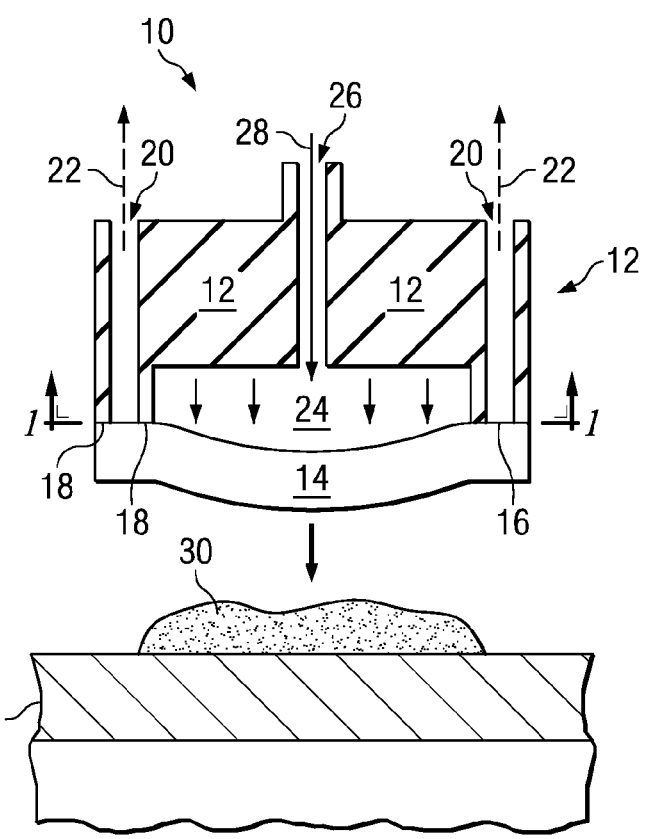
FIG. 2A is a cutaway side view of the die handling collet according to the example of a preferred embodiment of the invention of FIG. 1 shown in the context of a die attach system and method.

In general, the invention provides a die handling collet and related systems and methods for improved die handling in semiconductor device manufacturing processes, particularly die attach processes. Referring primarily to FIG. 1 and FIG. 2A, a bottom view (FIG. 1) and cutaway side view (FIG. 2A) of a collet 10 according to a preferred embodiment of the invention is described. A body 12, preferably made from plastic, metal, or other suitably rigid material, is capable of receiving a die 14 (FIG. 2A). A vacuum groove 16 is provided at the edge of the body 12. The vacuum groove 16 is incorporated into a die-bearing surface 18 of the body 12, preferably entirely around the periphery. The vacuum groove 16 is in communication with vacuum ports 20 for transmitting a vacuum force, indicated by arrow 22, generated by a suitable mechanism such as a pump (not shown). The vacuum groove 16 preferably distributes the vacuum force around the periphery of the die-bearing surface 18 for holding a die 14 during handling and placement. A chamber 24 is incorporated within the body 12 and is preferably encompassed by the die-bearing surface 18. One side of the chamber 24 is open such that a die 14 placed on the bearing surface 18 completes the enclosure. Within the chamber 24, a port 26 is provided for expelling pressurized gas, preferably air, indicated by arrow 28. The expelled gas 28 pressurizes the chamber 24, exerting a pushing force on the adjacent surface of the die 14. The pushing force preferably opposes the die flexion which tends to occur due to the application of the vacuum force 22, preventing or reducing the temporary formation of a concavity on the outer surface of the die 14 due to flexing. Preferably, during die attach, the chamber 24 is sufficiently pressurized to cause the die 14 to bow outward slightly in a position convex to the adjacent die pad 32 or intervening die attach adhesive 30 (FIG. 2A).

Figure 2B:
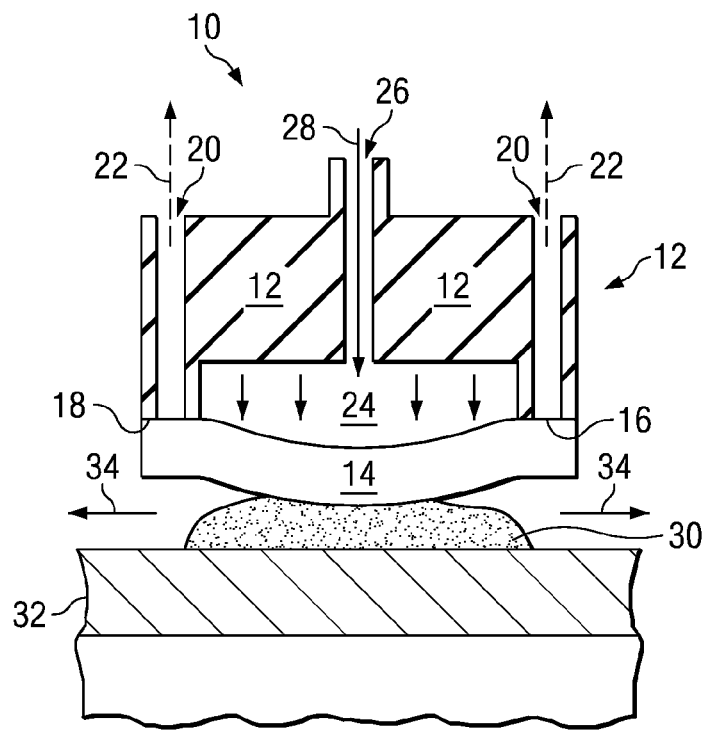
FIG. 2B is a cutaway side view of the die handling collet in a continuation of the example of a preferred embodiment of the invention of FIG. 2A shown in the context of a die attach system and method.
Figure 2C:
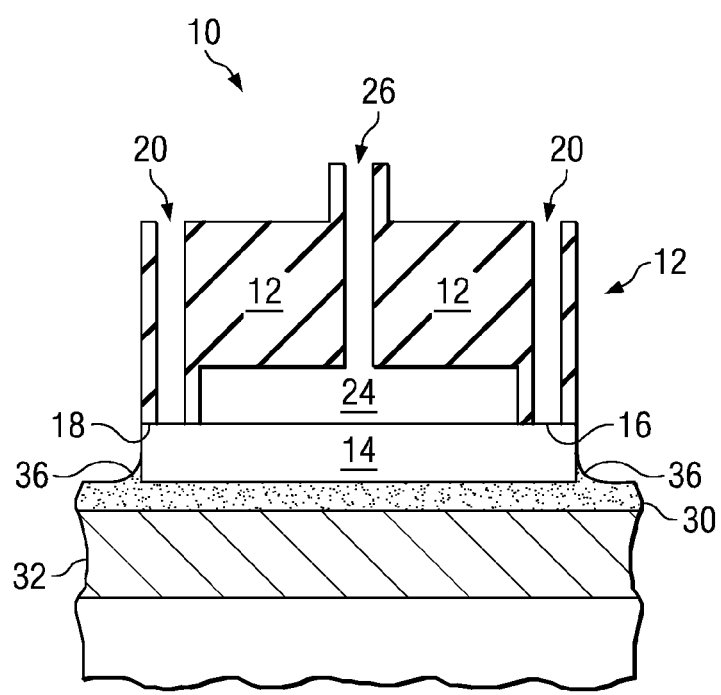
FIG. 2C is a cutaway side view of the die handling collet in a continuation of the example of a preferred embodiment of the invention of FIGS. 2A and 2B shown in the context of a die attach system and method.

Now referring primarily to FIG. 2B, the collet 10 is shown in the context of further steps in a die attach method according to preferred embodiments of the invention. As illustrated, using the preferred embodiment of the collet 10 shown and described above, the expelled air 28 within the chamber 24 is preferably used to flex the die 14 in order to present a convex surface to the die attach material 30 pre-applied to the die pad 32. The convex surface of the die 14, as indicated by arrows 34, tends to expel air from between the die 14 and die attach adhesive 30 during the ultimate placement of the die, reducing the frequency and magnitude of void formation. Although the use of a convex surface is preferred, in an alternative embodiment, the die may be flexed by the expelled air 28 by an amount adapted to counter any inward flexion caused by the vacuum 22, and calculated to prevent the outward flexion of the die 14. This implementation may be preferred for example with particularly delicate dice, preventing or attenuating flexion and presenting a substantially flat die surface to the die pad 32 and the intervening die attach adhesive 30, promoting a uniform thickness of die attach material 30. It should be appreciated by those skilled in the arts that other alternative embodiments are possible without departure from the invention, for example, die attach processes using die adhesive film may also advantageously use the invention. As depicted in FIG. 2C, as the collet 10 brings the die 14 into position on the die attach adhesive 30, the pushing and vacuum forces may be reduced or eliminated, ultimately enabling the collet 10 to be removed after the die 14 is placed.

Figure 4B:
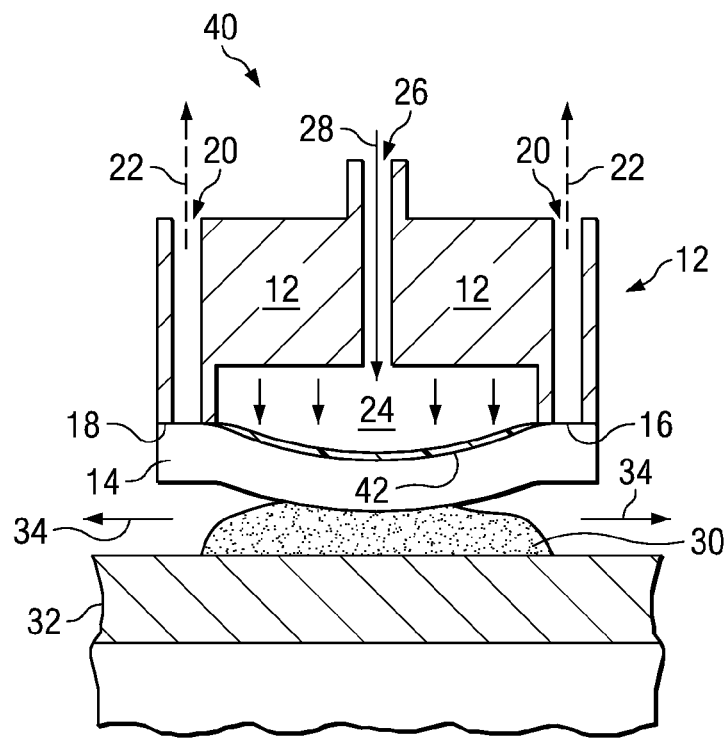
FIG. 4B is a cutaway side view of the die handling collet in a continuation of the example of a preferred embodiment of the invention of FIG. 4A shown in the context of a die attach system and method.
Figure 4C:
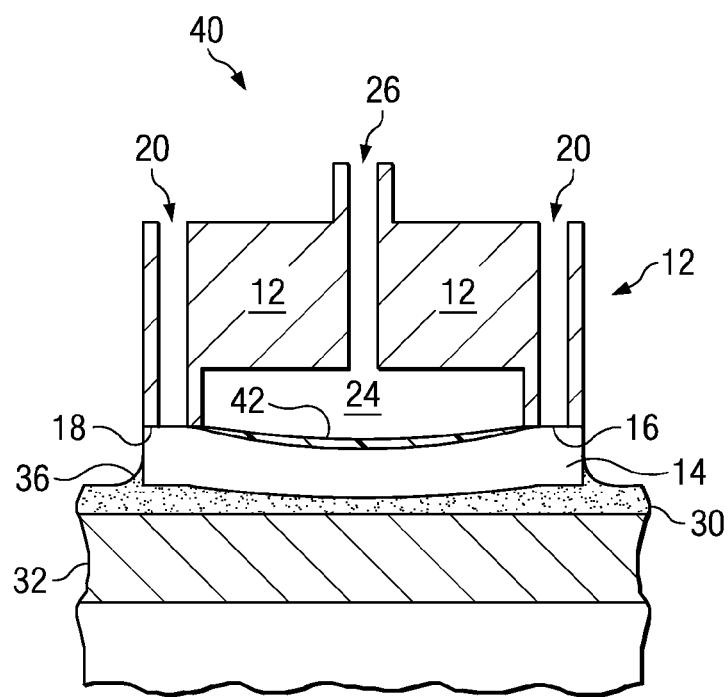
FIG. 4C is a cutaway side view of the die handling collet in a continuation of the example of a preferred embodiment of the invention of FIGS. 4A and 4B shown in the context of a die attach system and method for implementing a preferred embodiment of a semiconductor device assembly of the invention.

An alternative preferred embodiment of a collet 40 of the invention is depicted in a bottom view in FIG. 3, and in corresponding cutaway side views in FIG. 4A through 4C showing an example of a system and method for its use. As described elsewhere herein, the collet 40 has a body 12 preferably made from plastic, metal, or like material and is capable of receiving a die 14 as shown. A vacuum groove 16 is incorporated into the die-bearing surface 18 of the collet 40, preferably at the edge of the body 12 and around its periphery. The vacuum groove 16 is provided with a vacuum force 22 through suitable vacuum ports 20. The vacuum groove 16 preferably evenly distributes the vacuum force 22 around the periphery of the die-bearing surface 18 for holding a die 14 during handling and placement. An interior chamber 24 is incorporated within the die-bearing surface 18 of the body 12. A port 26 is provided for expelling pressurized air or other gas 28 into the chamber 24. As in the other preferred embodiment described, the expelled air 28 pressurizes the chamber 24 to prevent the formation of a concavity in the outer surface of an adjacent die 14 due to flexion in response to the application of the vacuum force 22. Preferably, during die attach the chamber 24 is sufficiently pressurized to cause the die to bow outward slightly in a position convex to the adjacent die attach adhesive 30 as shown in FIG. 4A and FIG. 4B. In this alternative embodiment, the collet 40 also includes a support skin 42. The support skin 42 is preferably permanently attached to the die bearing surface 18 of the collet body 12. The support skin 42 is made from a flexible material such as, for example, a thin film of Teflon, Mylar, (both registered trademarks of DuPont Corporation), polymer, or the like. In operation, while the vacuum 22 exerted in the vacuum groove 16 holds the die 14, the pushing force of air 28 expelled into the cavity 24 pressurizes the support skin 42. As a result, the center region of the die 14 may be caused to bow outward in a shape convex relative to the die attach adhesive 30. As with the above-described embodiments, using this preferred method, the bowed center region of the die 14 die contacts the die attach adhesive 30 first and then spreads outward toward the periphery as it is moved toward the die pad and as the pushing force on the die 14 is diminished. This sequence avoids the trapping of air during die attach, helps to form the die attach adhesive into a bond line 30 of uniform thickness, and fosters the formation of suitable fillets 36. Alternatively, for example in cases where the die 14 may be particularly susceptible to damage from flexing, the outward pressure 28 may be regulated to hold the die 14 substantially flat relative to the die pad 32 and attach adhesive 30. Thus the invention may be used for regulating the shape of the die surface presented to the attach locale, balancing against inward flexion exerted by the vacuum force 22, but refraining from bowing the die 14 outward in order to prevent inducing stress on the die 14 in cases where increased gentleness is required. In another alternative embodiment, illustrated in the final position of the die 14 in FIG. 4C, the bond line 30 is cured with a "smile" profile as shown, preferably uniformly thinner in the central region of the die 14 and progressively thicker approaching the periphery.

As shown and described herein, preferred embodiments of the invention contribute one or more useful advantages to the art. The invention provides advantages including but not limited to improved die handling capabilities and reductions in damage during die attach in microelectronic semiconductor device package assembly. While the invention has been described with reference to certain illustrative embodiments, the methods, apparatus, and systems described are not intended to be construed in a limiting sense. Various modifications and combinations of the illustrative embodiments as well as other advantages and embodiments of the invention will be apparent to persons skilled in the art upon reference to the description, drawings, and claims.

We claim:

1. A method for attaching a semiconductor die to a die pad comprising the steps of:

positioning a semiconductor die on a bearing surface of a collet and retaining the die on the bearing surface of the collet using a vacuum force applied to a first surface of the die;

exerting a pushing force on the first surface of the die adjacent to the applied vacuum force in an opposite direction to the vacuum force;

moving the die under the vacuum force and the pushing force to a die pad;

placing the die on the die pad, wherein die attach adhesive is interposed between a second surface of the die and the die pad; and thereafter releasing the die from the collet.

2. The method for attaching a semiconductor die to a die pad according to claim 1 wherein the pushing force is applied using gas channeled within the collet.

3. The method for attaching a semiconductor die to a die pad according to claim 1 wherein the pushing force is applied to substantially flatten the second die surface presented to the die pad.

4. The method for attaching a semiconductor die to a die pad according to claim 1 wherein the pushing force is applied to bow the central region of the second surface toward the die pad, wherein the central region of the die contacts the adhesive prior to the die periphery when placed.

5. The method for attaching a semiconductor die to a die pad according to claim 1 wherein the vacuum force is applied to a portion of the periphery of the first die surface.

6. The method for attaching a semiconductor die to a die pad according to claim 1 wherein the vacuum force is applied to the entire periphery of the first die surface.

7. The method for attaching a semiconductor die to a die pad according to claim 1 wherein the die attach adhesive is applied to the die pad.

8. The method for attaching a semiconductor die to a die pad according to claim 1 wherein the die attach adhesive is applied to the second surface of the die.

9. The method for attaching a semiconductor die to a die pad according to claim 1 wherein the die attach adhesive comprises a curable semisolid die attach adhesive.

10. The method for attaching a semiconductor die to a die pad according to claim 1 wherein the die attach adhesive comprises a die attach adhesive tape.

11. The method for attaching a semiconductor die to a die pad according to claim 1 further comprising the step of using a flexible skin to protect at least a portion of the first die surface from direct contact with the collet.

* * * * *